US010615024B1

(12) United States Patent
Roddy et al.

(10) Patent No.: US 10,615,024 B1
(45) Date of Patent: Apr. 7, 2020

(54) SPIRAL ELECTROSTATIC ANALYZER (71) Applicant: Government of the United States, as represented by the Secretary of the Air Force, Kirtland AFB, NM (US)

(72) Inventors: Patrick Roddy, Albuquerque, NM (US); David Barton, Los Ranchos, NM (US); Joseph Coombs, Albuquerque, NM (US); John Ballenthin, Albuquerque, NM (US); John McGarity, Lancaster, MA (US); Scott Kratochvil, Albuquerque, NM (US)

(73) Assignee: THE GOVERNMENT OF THE UNITED STATES OF AMERICA AS REPRESENTED BY THE SECRETARY OF THE AIR FORCE, Washington, DC (US)

( * ) Notice: Subject to any disclaimer, the term of this patent is extended or adjusted under 35 U.S.C. 154(b) by 0 days.

(21) Appl. No.: 16/223,425

(22) Filed: Dec. 18, 2018

Related U.S. Application Data (60) Provisional application No. 62/694,686, filed on Jul. 6, 2018.

(51) Int. Cl.
*H01J 49/48* (2006.01)
(52) U.S. Cl.
CPC .................... *H01J 49/48* (2013.01)
(58) Field of Classification Search
CPC ........................................ H01J 49/48
USPC .............. 250/305, 396 R, 397, 400, 396 ML
See application file for complete search history.

(56) References Cited

U.S. PATENT DOCUMENTS 8,658,984 B2 * 2/2014 Makarov ................. H01J 49/40
250/282

OTHER PUBLICATIONS

Smith, ZK. and JR. Day (1971), Mathematical model of ARC Pioneer 6/7 plasma probe, Rev. Sci. Inst., 42, 7, p. 968.
Johnstone, AD., et al. (1985), A space-borne plasma analyzer for 3-dimensional measurements of the velocity distribution, IEEE Transaction on Nuclear Science, 32, 1, pp. 139-144.
Sablik, M. J., D. Golimowski, J. R. Sharber, and J. D. Winningham (1988), Computer simulation of a 360 degree field-of-view "top-hat" electrostatic analyzer, Rev. Sci. Inst., 59, 146.
(Continued)

*Primary Examiner* — Nicole M Ippolito
*Assistant Examiner* — Hanway Chang
(74) *Attorney, Agent, or Firm* — James M. Skorich (57) ABSTRACT

An electrostatic analyzer (ESA) includes a coaxial structure having an outer conductive cylinder, an inner conductive cylinder, and one or more pathways disposed therebetween and extending from a first end to a second end of the coaxial structure. The outer conductive cylinder and the inner conductive cylinder may each be structurally configured to receive a bias voltage for creation of a predetermined electric field therebetween that allows for passage of charged particles with a predetermined energy/charge band along a helical path through the coaxial structure. The ESA may further include an entrance filter on the first end of the coaxial structure that defines a plurality of openings aligned at a predetermined angle thereby limiting one or more fields of view between a pathway through the ESA and the external environment to filter particles, by their trajectory, from entering the pathway for analysis by the ESA.

11 Claims, 5 Drawing Sheets

(56) References Cited

OTHER PUBLICATIONS

Hughes, A. L. and V. Rojansky (1929), On the analysis of electronic velocities by electrostatic means, Phys. Rev. 34, 284.

McComas, D. J., et al. (1998) The Cassini Ion Mass Spectrometer, Measurement Techniques in Space Plasmas: Particles, R. F. Pfaff, J. E Borovsky, and D. T. Young, editors. Geophysical Monograph 102.

Neugebauer, M. and CWSnyder (1962), Mission of Mariner II—Preliminary Observations, Science, DOI: 10.1126/science.138.3545.1095-a.

B.K. Dichter, et. al, "Compact Environmental Anamoly Sensor (CEASE): A Novel Spacecraft Instrument for in Situ Measurements of Environmental Conditions," IEEE Trans. Nucl. Sci., vol. 45, No. 6, pp. 2758-2764, 1998.

B.K. Dichter, et. al, "Initial on-Orbit Results From the Compact Environmental Anomaly Sensor (CEASE)," IEEE Trans. Nucl. Sci., vol. 48, No. 6, pp. 2022-2028, 2001.

Bronislaw K. Dichter, John McGarity, E. G. Mullen, Donald Brautigam, Gary E. Galica, Michael J. Golightly, "Calibration of the Compact Environmental Anomaly Sensor (CEASE) for the DSX space weather mission," Proc. SPIE 7438, Solar Physics and Space Weather Instrumentation III, 743807 (Sep. 23, 2009).

P. P. Jenkins et al., "Initial results from the TacSat-4 solar cell experiment," 2013 IEEE 39th Photovoltaic Specialists Conference (PVSC), Tampa, FL, 2013, pp. 3108-3111.

Brautigam, D.H. (2002). CRRES in review: Space weather and its effects on technology. Journal of Atmospheric and Solar-Terrestrial Physics. 64. 1709-1721. 10.1016/S1364-6826(02)00121-9.

J. Bowman, "J1: a small Forth CPU core for FPGAs," in 26th euroForth conference, pp. 43-46, 2010.

S.R. Messenger, et al., TacSat—4 Radiation Environment and Solar Cell Degradation Correlations Using Onboard Experiments, 50th IEEE Nuclear Space and Radiation Electronics Conference, San Francisco, CA, Jul. 8-12, 2013.

J. Allison et al., "Geant4 developments and applications," in IEEE Transactions on Nuclear Science, vol. 53, No. 1, pp. 270-278, Feb. 2006.

L. Desorgher et al., "ESA Next Generation Radiation Monitor," 2013 14th European Conference on Radiation and Its Effects on Components and Systems (RADECS), Oxford, 2013, pp. 1-5.

K. Ryden, "The MERLIN space weather monitor and its planned flight on the Galileo system testbed satellite (GSTB-V2/A)", 55th Int. Astronautical Congress, 2004.

A. Mohammadzadeh et al., "The ESA Standard Radiation Environment Monitor program first results from PROBA-I and INTEGRAL," in IEEE Transactions on Nuclear Science, vol. 50, No. 6, pp. 2272-2277, Dec. 2003.

W. R. Johnston, et. al, "Recent updates to the AE9/AP9/SPM radiation belt and space plasma specification model," IEEE Trans. Nucl. Sci, vol. 62, No. 6, pp. 2760-2766, doi:10.1109/TNS.2015.2476470.

C. D. Lindstrom et al., "The Compact Environmental Anomaly Sensor Risk Reduction: A Pathfinder for Operational Energetic Charged Particle Sensors," in IEEE Transactions on Nuclear Science, vol. 65, No. 1, pp. 439-447, Jan. 2018.

\* cited by examiner

SPIRAL ELECTROSTATIC ANALYZER

CROSS-REFERENCE TO RELATED APPLICATIONS

This application claims the benefit of U.S. Provisional Application No. 62/694,686 filed on Jul. 6, 2018, the entire content of which is hereby incorporated by reference.

STATEMENT OF GOVERNMENT INTEREST

The invention described herein may be manufactured, used, and licensed by or for the Government of the United States for all governmental purposes without the payment of any royalty.

BACKGROUND

An electrostatic analyzer (ESA) is an instrument used in ion optics that employs an electric field allowing the passage of only those ions or electrons having a given specific energy. ESAs may be used as components of space instrumentation, e.g., to limit a scanning (sensing) energy range and the range of particles targeted for detection and scientific measurement.

An ESA may have many varied manifestations, where each can be designed to meet the specific needs of individual systems. As the name suggests, and as stated above, an ESA uses an electrostatic field to select a charged particle of a given charge to energy ratio. A simple example of an ESA includes a single electrically charged component to deflect charged particles. A more sophisticated example of an ESA can include parallel biased plates—such a device may act as a high pass filter with particles below a specific energy colliding with one plate, while higher energy particles pass though the device. The energy cutoff of such a device can be varied by changing the bias on one or both of the plates. If a charged particle detector, such as a channel electron multiplier (CEM) or microchannel plate (MCP), is placed at the output of such an ESA, flux versus energy characteristics for an incident particle beam may be acquired.

Another useful arrangement for an ESA may be achieved by curving the plates of the ESA into a cylindrical shape. In such an ESA, particles with a kinetic energy above a given threshold may strike an outer cylinder, and those having energy below an energy threshold may strike an inner cylinder, essentially yielding an energy bandpass filter. Additionally, particles with energy in the selected bandpass can successfully traverse the ESA if their arrival angles fall within a field of view for the device. By varying the potential on the inner and outer cylinders, the center of the energy bandpass can be scanned over a range or it can be held fixed. This style of cylindrical ESA has been in laboratory use since at least the 1920s, has been used as a spaceflight instrument thereafter, and has played a significant role in the discovery of solar wind early in the space age. A desirable feature of the foregoing type of arrangement is that the ratio of the energy bandpass to the mean energy may be constant over all energy values. As such, there are a number of variations on the theme of curved plate ESAs, where the angular section of the ESA is a frequently varied parameter (e.g., with 90-, 127-, 180- and 270-degree sections being common parameters), and where each angular distance usually conveys some benefit to other design compromises.

Another geometric variant of an ESA includes a spherical section ESA, which has nested spherical electrodes as opposed to the cylinders discussed above. This geometry may have many of the same features of the cylindrical geometry, but it may additionally provide the ability to select for an arrival angle of incoming particles. That is, where a cylindrical section may be used for a laboratory produced beam that originates from only one direction, a geophysical source of charged particles may be coming from many directions simultaneously, and thus, a spherical section ESA may be better suited for analyzing this natural source. A further evolution of the spherical section ESA includes a top-hat ESA, which may include additional electro-optics at the input of the ESA to further increase the field of view. Many extraplanetary probes carry complicated top-hat ESAs that incorporate further technology allowing them to also act as mass spectrometers.

While the evolution of scientific spaceflight ESAs has trended towards capable, complex, large, and expensive devices, the path towards simple, small, and relatively inexpensive devices aimed at environmental monitoring has generally been neglected. There thus remains a need for ESA improvements.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. The drawings are not necessarily to scale, emphasis instead being placed upon illustrating the principles of the devices, systems, and methods described herein. In these drawings, like reference numerals may identify corresponding elements.

DETAILED DESCRIPTION

The various methods, systems, apparatuses, and devices described herein generally relate to electrostatic analyzers (ESAs).

While this invention is susceptible of being embodied in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

In general, the devices, systems, and methods described herein may include an electrostatic analyzer (ESA). Specifically, an ESA according to the present teachings may include an instrument that is used to determine the energy spectrum of a charged particle population, and/or to filter such a spectrum to select particles within a particular energy band. More specifically, an ESA according to the present teachings may only filter one component of a particle's velocity vector, which can allow for the ESA to include a relatively compact design and can extend the range of the ESA to higher energies.

For example, an ESA as described herein may be integrated into a space particle sensor or the like for characterizing the energy spectrum of plasma energy (e.g., about 50 eV to about 50 keV) electrons in a near-earth environment or the like. As discussed herein, an ESA may include a spiral or helical geometry that permits a relatively compact design and a relatively high-energy range (compared to a more conventional ESA) because the filtering and analysis may be done on only one component of the particle's kinetic energy vector. In addition, an ESA as described herein may include features structurally configured to prevent light pollution. Such an ESA may be used on satellites (e.g., by a commercial satellite company, or as part of a space science mission) or on other space equipment or vehicles, e.g., for space weather science, as an energetic electron filter, for general space particle instrumentation, and the like.

Figure 1:
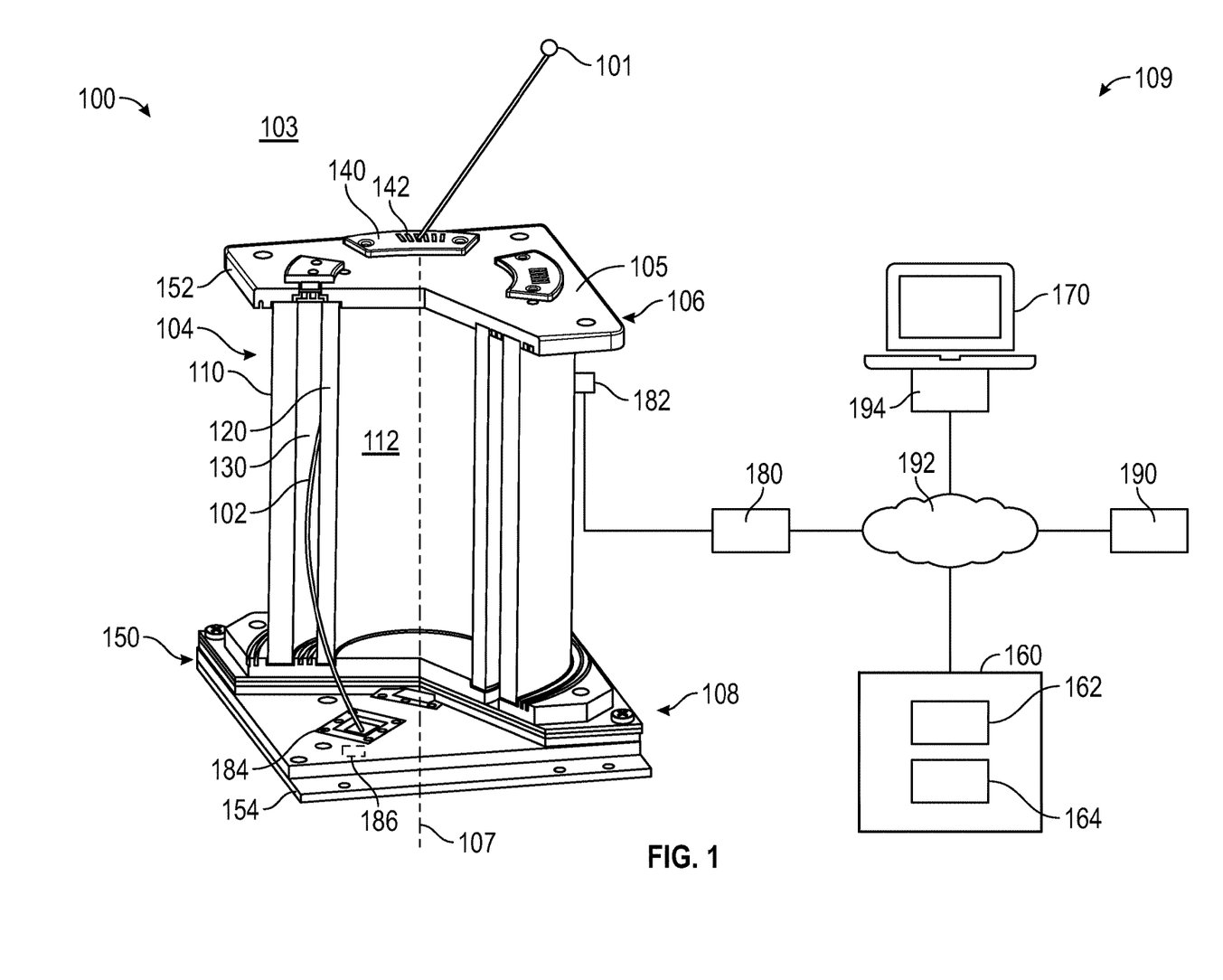
FIG. 1 illustrates an electrostatic analyzer (ESA), in accordance with a representative embodiment.

FIG. 1 illustrates an ESA 100, in accordance with a representative embodiment. In general, the ESA 100 may be an apparatus that is structurally configured to filter and detect a charged particle 101 based on its (i) energy (e.g., kinetic energy) and (ii) arrival trajectory or path (e.g., its arrival angle relative to the ESA 100). The ESA 100 may generally be a spiral ESA, or one that defines a helical path 102 for charged particles 101 to travel therein and therethrough. The ESA 100 may generally include a coaxial structure 104 and one or more entrance filters 140.

The coaxial structure 104 of the ESA 100 may include an outer conductive cylinder 110, an inner conductive cylinder 120, and one or more pathways 130 disposed between the outer conductive cylinder 110 and the inner conductive cylinder 120 that extend from a first end 106 of the coaxial structure 104 to a second end 108 of the coaxial structure 104. The outer conductive cylinder 110 may define a void 112 therein, where the inner conductive cylinder 120 is disposed at least partially within the void 112. Generally, the outer conductive cylinder 110 and the inner conductive cylinder 120 may each be structurally configured to receive a bias voltage for creation of a predetermined electric field therebetween that allows for the passage of charged particles 101 with a predetermined energy/charge band along a helical path 102 through the coaxial structure 104. The predetermined energy (by which particles may be filtered for analysis by the ESA 100) may include a specific charge of a particle, a particle having a specific kinetic energy, and combinations thereof. Thus, the kinetic energy/charge ratio may be the salient attribute for filtering the charged particles 101, and there may be a specific, predetermined bandwidth of acceptance—in this manner, it will be understood that predetermined energy as described herein may include a kinetic energy/charge ratio.

As discussed herein, the ESA 100 may include one or more entrance filters 140. Specifically, an entrance filter 140 may be disposed on the first end 106 of the coaxial structure 104, e.g., between one or more of the pathways 130 contained therein and an external environment 103. One or more of the entrance filters 140 may define a plurality of openings 142 aligned at a predetermined angle thereby limiting one or more fields of view between a pathway 130 and the external environment 130. The predetermined angle, and thus the openings 142, may be structurally configured to filter particles, by their trajectory, from entering a pathway 130 for analysis by the ESA 100. Further, particles that traverse through a pathway 130 from the external environment 130 to the second end 108 of the coaxial structure 104 may be controlled according to a kinetic energy of the particles. Controlling of the particles through the ESA 100 may be provided by the bias voltage applied to the ESA 100, i.e., to one or more of the outer conductive cylinder 110 and the inner conductive cylinder 120. Controlling of the particles through the ESA 100 may also or instead be provided by a length and a radius of one or more of the outer conductive cylinder 110 and the inner conductive cylinder 120. Further, controlling of the particles through the ESA 100 may also or instead be provided by the predetermined angle of one or more of the openings 142 of one or more of the entrance filters 140. For example, the predetermined angle of one or more of the openings 142 of one or more of the entrance filters 140 may be adjustable.

The adjustability of the predetermined angle may be provided by interchanging one entrance filter 140 (e.g., an entrance filter 140 having a first set of openings 142 with a first angle) with another entrance filter 140 (e.g., a different entrance filter 140 having a second set of openings 142 with a second angle that is different from the first angle). Also, or instead, the openings 142 on the entrance filter 140 may be adjustable, e.g., a size, a shape, an entrance angle, and so on, may be adjustable on the entrance filter 140 itself, such that the predetermined angle may be adjusted without removing the entrance filter 140. Moreover, the entrance filter 140 itself may be adjustable (e.g., relative to the general structure of the ESA 100) to adjust the predetermined angle or another parameter.

In certain implementations, the predetermined angle is between 10-degrees and 80-degrees relative to a plane disposed through the first end 106 of the coaxial structure 104 (e.g., a plane that intersects a substantial portion of the top surface 105 of the ESA 100, such as a plane that is substantially orthogonal to the cylinder axis 107). More generally, the predetermined angle may be any angle between 0-degrees and 90-degrees. Thus, it will be understood that, theoretically, there is generally not a real limit to what the predetermined angle can be—and therefore, many different configurations for the openings 142 are possible.

As shown in FIG. 1, there may be a separate entrance filter 140 for each pathway 130 in the ESA 100, and each of these separate entrance filters 140 may include its own plurality of openings 142. By way of example, three entrance filters 140 are shown in FIG. 1, but it will be understood that more or less are possible. In certain implementations, the predetermined angle of the plurality of openings 142 for each separate entrance filter 140 may be the same. In other implementations, the predetermined angle of the plurality of openings 142 for each separate entrance filter 140 may be different.

As discussed herein, and as explained in more detail with reference to FIGS. 2-4, the ESA 100 shown in FIG. 1 may include channels that contain a pathway 130 for charged particles 101 to travel through, i.e., through the ESA 100 from the first end 106 of the coaxial structure 104 to the second end 108 of the coaxial structure 104.

Turning back to FIG. 1, the ESA 100 may include a housing 150. The housing 150 may hold or contain one or more of the components of the ESA 100. For example, and as shown in the figure, the top surface 105 of the ESA 100 may be defined by a surface of the housing 150. Thus, an entrance filter 140 for the ESA 100 may be disposed on the housing 150, or a portion thereof that is coupled to the first end 106 of the coaxial structure 104. The housing 150, or a portion thereof, may be removable and replaceable on the first end 106 of the coaxial structure 104. In this manner, removing and replacing a portion of the housing 150 may include removing and replacing an entrance filter 140 (e.g., for adjustment of the predetermined angle) or another component of the ESA 100. In certain implementations, the housing 150, or a portion thereof, may be adjustable on the first end 106 of the coaxial structure 104. In this manner, adjustment of a portion of the housing 150 may include adjustment of an entrance filter 140 (e.g., for adjustment of the predetermined angle) or another component of the ESA 100. The housing 150 may include one or more plates 152 affixed to the coaxial structure 104 or another portion of the ESA 100.

The ESA 100 may further include one or more endcaps 154, e.g., further to the housing 150 or in lieu of the housing 150 (or a portion thereof). An endcap 154 may be engaged with at least one of the first end 106 of the coaxial structure 104 and the second end 106 of the coaxial structure 104, e.g., both ends of the coaxial structure 104. Further, one or more of the endcaps 154 may be insulated. Also, or instead, other portions of the housing 150 or the ESA 100 may be insulated.

The ESA 100 (or a system 109 containing the ESA 100) may include a controller 160, a computing device 170, one or more power sources 180, and other hardware 190, where one or more of these components may be interconnected via a data network 192 or the like using one or more communication interfaces 194.

The ESA 100 may also include an electrical connection 182 coupling the ESA 100 to one or more of the power sources 180. The electrical connection 182 may include separate connections for each cylinder of the coaxial structure 104, e.g., a first electrical connection coupled to the outer conductive cylinder 110 and a second electrical connection coupled to the inner conductive cylinder 120. Thus, a power source 180 may be coupled to the electrical connection 182, e.g., at least one of the aforementioned first electrical connection and second electrical connection. Other electrical connections 182 are also or instead possible. The controller 160 may be configured to receive an input to control at least one of the power source 180 and the electrical connection 182 (e.g., the first electrical connection and the second electrical connection). In this manner, the controller 160 may be configured to adjust the bias voltage supplied to the ESA 100—e.g., a first bias voltage applied to the outer conductive cylinder 110 and a second bias voltage applied to the inner conductive cylinder 120.

The ESA 100 may further include a charge multiplier 184. The charge multiplier 184 may be structurally configured to collect and amplify a signal obtained from a particle at the second end 108 of the coaxial structure 104. For example, the ESA 100 may include a charge multiplier 184 disposed beneath the coaxial structure 104, where the charge multiplier 184 is structurally configured to act as a background detector for the ESA 100. The charge multiplier 184 may also or instead be coaxially aligned with the coaxial structure 104. The ESA 100 may also or instead include a wire mesh 186 (or the like) that is structurally configured to contain an electric field of a particle and provide acceleration to the particle.

The controller 160 may be used for controlling operation of one or more of the components of the system 109 or the ESA 100, e.g., the entrance filter 140, the power source 180 (or otherwise the bias voltage supplied to the ESA 100), the charge multiplier 184, and so on. The controller 160 may include, or otherwise be in communication with, a processor 162 and a memory 164. The controller 160 may be electronically coupled (e.g., wired or wirelessly) in a communicating relationship with one or more of the components of the system 109. Thus, in an implementation, the controller 160 may include a processor 162 and a memory 164, where the processor 162 is configured to control the ESA 100 according to one or more of analyzer feedback, predetermined instructions, instructions based on algorithmic calculations, and the like.

As discussed above, the controller 160 may be operable to control the components of the system 109, where the controller 160 may include any combination of software and/or processing circuitry suitable for controlling the various components of the system 109 described herein including without limitation processors, microprocessors, microcontrollers, application-specific integrated circuits, programmable gate arrays, and any other digital and/or analog components, as well as combinations of the foregoing, along with inputs and outputs for transceiving control signals, drive signals, power signals, sensor signals, and the like. In certain implementations, the controller 160 may include the processor 162 or other processing circuitry with sufficient computational power to provide related functions such as executing an operating system, providing a graphical user interface (e.g., to a display coupled to the controller 160 or another component of the system 109), set and provide rules and instructions for operation of the ESA 100 or another component of the system 109, convert sensed information into positioning or other instructions, and operate a web server or otherwise host remote operators and/or activity through the communications interface 194 such as that described below. In certain implementations, the controller 160 may include a printed circuit board, an Arduino controller or similar, a Raspberry Pi controller or the like, a prototyping board, or other computer related components.

The controller 160 may be a local controller disposed on the ESA 100, or a remote controller 160 otherwise in communication with the ESA 100 and its components. For example, one or more of the controller 160 and a user interface in communication with the controller 160 may be disposed on an external component (e.g., a computing device 170) in communication with the ESA 100 over a data network 192.

The processor 162 of the controller 160 may include an onboard processor for the ESA 100. The processor 162 may also or instead be disposed on a separate computing device 170 that is connected to the ESA 100 through a data network 192, e.g., using the communications interface 194, which may include a satellite communications system, a Wi-Fi transmitter and receiver, and the like. The processor 162 may be any as described herein or otherwise known in the art. The processor 162 may be included on the controller 160, or it may be separate from the controller 160, e.g., it may be included on a computing device 170 in communication with the controller 160 or another component of the system 109. In an implementation, the processor 162 is included on, or in communication with, a server that hosts an application for operating and controlling the system 109.

The memory 164 may be any as described herein or otherwise known in the art. The memory 164 may contain computer code and may store data such as sequences of analysis or otherwise for the ESA 100. The memory 164 may contain computer executable code stored thereon that provides instructions for the processor 162 for implementation. The memory 164 may include a non-transitory computer readable medium.

The system 109 may include a computing device 170 in communication with one or more of the components of the system 109 including without limitation the controller 160. The computing device 170 may include any components within the system 109 operated by users or otherwise to manage, monitor, communicate with, or otherwise interact with other components in the system 109. This may include desktop computers, laptop computers, network computers, tablets, smartphones, smart watches, or any other device that can participate in the system 109 as contemplated herein. In an implementation, the computing device 170 (and a user interface thereof) is integral with another participant in the system 109.

The data network 192 may be any network(s) or inter-network(s) suitable for communicating data and control information among participants in the system 109. This may include a satellite network, public networks such as the Internet, private networks, telecommunications networks such as the Public Switched Telephone Network or cellular networks using third generation (e.g., 3G or IMT-2000), fourth generation (e.g., LTE (E-UTRA) or WiMAX-Advanced (IEEE 802.16m) and/or other technologies, as well as any of a variety of corporate area or local area networks and other switches, routers, hubs, gateways, and the like that might be used to carry data among participants in the system 109. The data network 192 may include wired or wireless networks, or any combination thereof. As discussed herein, the data network 192 may also or instead include a satellite communications system. One skilled in the art will also recognize that the participants shown the system 109 need not be connected by a data network 192, and thus can be configured to work in conjunction with other participants independent of the data network 192.

Communication over the data network 192, or other communication between components of the system 109 described herein, may be provided via one or more communications interfaces 194. The communications interface 194 may include, e.g., a Wi-Fi receiver and transmitter to allow the logic calculations to be performed on a separate computing device 170. This may include connections to smartphone applications and the like. More generally, the communications interface 194 may be suited such that any of the components of the system 109 can communicate with one another. Thus, the communications interface 194 may be present on one or more of the components of the system 109. The communications interface 194 may include, or be connected in a communicating relationship with, a network interface or the like. The communications interface 194 may include any combination of hardware and software suitable for coupling the components of the system 109 to a remote device (e.g., a computing device 170 such as a remote computer or the like) in a communicating relationship through a data network 192. By way of example and not limitation, this may include electronics for a wired or wireless Ethernet connection operating according to the IEEE 802.11 standard (or any variation thereof), or any other short or long-range wireless networking components or the like. This may include hardware for short-range data communications such as Bluetooth or an infrared transceiver, which may be used to couple into a local area network or the like that is in turn coupled to a data network 192 such as the internet. This may also or instead include hardware/software for a WiMAX connection or a cellular network connection (using, e.g., CDMA, GSM, LTE, or any other suitable protocol or combination of protocols). Additionally, the controller 160 may be configured to control participation by the components of the system 109 in any network to which the communications interface 194 is connected, such as by autonomously connecting to the data network 192 to retrieve status updates and the like.

The system 109 may include other hardware 190. In certain implementations, the other hardware 190 may include a camera or other sensors. The other hardware 190 may also or instead include input devices such as a keyboard, a touchpad, a computer mouse, a switch, a dial, a button, and the like, as well as output devices such as a display, a speaker or other audio transducer, light emitting diodes or other lighting or display components, and the like. Other hardware 190 of system 109 may also or instead include a variety of cable connections and/or hardware adapters for connecting to, e.g., external computers, external hardware, external instrumentation or data acquisition systems, and the like. The other hardware 190 may also or instead include mechanical devices for movement of one or more components of the system 109, e.g., actuators, motors, gears, and the like.

The power source 180 may include any as known in the art. For example, the power source 180 may include a battery, a rechargeable power supply (e.g., utilizing energy from the sun), and so on.

An ESA 100 according to the present teachings may exploit the inability of a cylindrical section ESA to select the energy component parallel to a cylinder axis 107 through the ESA 100. That is, the 1/r electric field between the cylinders in the ESA 100 may be purely radial. To a particle fired between the plates, purely parallel to the cylinder axis 107, it may appear to be traversing a parallel plate ESA and therefore may only act as a high pass filter. To a particle traveling tangential to the cylinders, it may appear to be moving in a more traditional cylindrical ESA. An ESA 100 according to the present teachings, however, may be designed to filter particles that have a path that is partially tangential and partially along the cylinder axis 107. By doing this, the ESA 100 can analyze particles of the same kinetic energy with a lower inter-plate potential difference relative to other ESA geometries. This may be highly desirable as higher voltages can present increased engineering challenges that lead to larger, more complex, and ultimately more expensive instruments. However, allowing particles to enter through an aperture and spiral through the ESA 100 may present a problem as particle energy and arrival angle are inexorably coupled, and, to compensate for this, the ESA 100 may incorporate the entrance filter 140, which acts as a view-limiting entrance aperture. The design of the entrance filters 140 can thus significantly alter performance characteristics of the ESA 100 by defining the look angle and field of views (variables gamma and epsilon in Equations 1 and 3 below). The design of the ESA 100 may permit relatively easy interchangeability of the entrance filters 140, which can allow for a single ESA 100 to be manufactured and later tuned to meet specific operational requirements of energy bandpass, geometric factor, and field of view, e.g., by replacing an entrance filter 140.

An ESA 100 according to the present teachings may also address another inherently crippling shortcoming of other ESAs—ultraviolet (UV) light contamination. Like a parallel plate ESA, a spiral ESA may offer very few bounce paths for light between an entrance aperture and the detector. A charge multiplier 184 (used in this and other ESAs) may be sensitive to both charged particles 101 and photons, particularly at solar wavelengths. Other spiral ESA designs can allow UV light entering one aperture to be measured on all detectors, even ones that are "pointed" away from the UV source. An ESA 100 according to the present teachings, however, may mitigate this problem by channelizing the individual particle paths in one or more of the following manners: (1) physical separation of channels by a dissipative insulator, or (2) the addition of many bounce paths, e.g., by a notch-and-vane geometry (or similar) for the cylinders. The manufacture of such a notch-and-vane geometry may be simplified through 3D printing (e.g., direct metal laser sintering) of the cylinders.

Thus, as described herein, the ESA 100 may include a coaxial structure 104 featuring two coaxial conductive cylinders placed one inside another—e.g., an outer conductive cylinder 110 and an inner conductive cylinder 120—with one or more electrical connections 182 to apply bias voltages. The length and radii of the cylinders may define the mean energy of particles that traverse the ESA 100 as set forth in the following equations.

$$\text{Kinetic Energy} = \frac{q(V_o - V_i)}{2\ln\left(\frac{r_o}{r_i}\right)\sin^2(\gamma \pm \varepsilon)} \quad \text{Equation 1}$$

$$\gamma = \sin^{-1}\left(\frac{\theta \bar{r}}{l}\right) \quad \text{Equation 2}$$

$$\varepsilon = \tan^{-1}\left(\frac{s_\theta}{d} + \tan\gamma\right) - \gamma \quad \text{Equation 3}$$

In these equations, 'V' is the voltage applied to a cylinder, 'r' is the radius of a cylinder, theta is the angular distance a particle travels through the ESA 100, and 'l' is the length of the cylinders. The subscripts 'i' and 'o' denote the inner and outer cylinders, respectively. The value r-bar is the mean radius of the cylinders. The variable gamma is the pitch of the spiral path that particles may take through the ESA 100. The variable epsilon is the half-angle acceptance defined by the geometry of the openings 142 of the entrance filter 140. The +/− epsilon in Equation 1 thus denotes the energy bandpass width of the ESA 100 as defined by the openings 142 of the entrance filter 140. S-theta is the angular width of a single opening 142 and 'd' is the thickness of the opening 142.

As described herein, the ESA 100 may include entrance filters 140 placed at specific locations around the top surface 105 of the ESA 100 and in-between the cylinders of the ESA 100. Each of the entrance filters 140 may include openings 142 that are angled in a certain manner to limit a field of view to provide at least some collimation of particles entering the ESA 100. The ESA 100 may further include an array of charge multipliers 184 at expected particle exit points to collect and amplify the signal obtained from a charged particle 101. The ESA 100 may further include grids of wire mesh 186, e.g., placed between the bottom of the cylinders and the charge multipliers 184 to contain the electric fields and to provide post-acceleration. The ESA 100 may further include specific channelization that is structurally configured to block UV light from cross-channel contamination or other contamination. The ESA 100 may also include endcaps 154, e.g., for insulating and/or mounting of the ESA 100.

Figure 2:
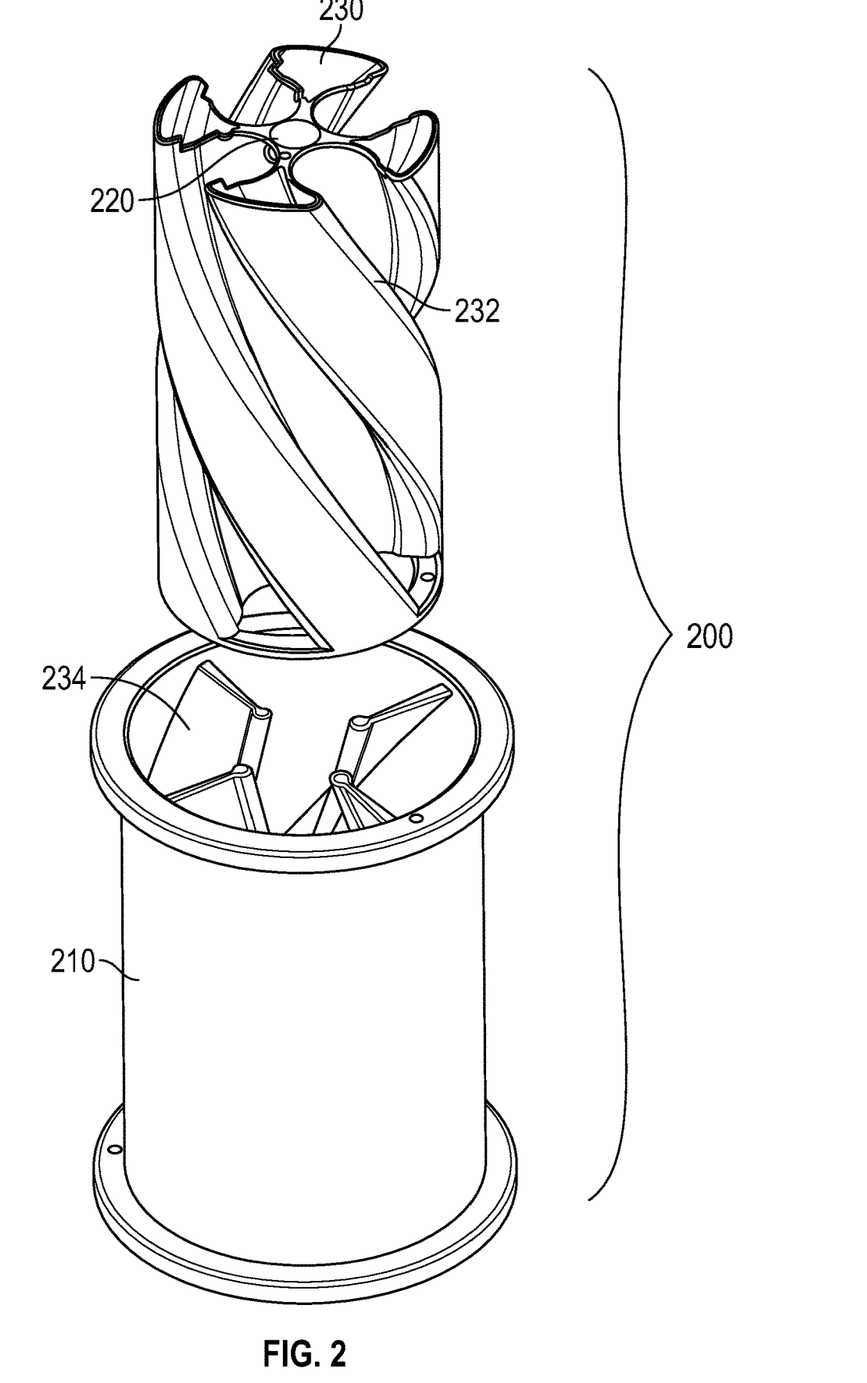
FIG. 2 illustrates an exploded view of a coaxial structure of an ESA, in accordance with a representative embodiment.
Figure 3:
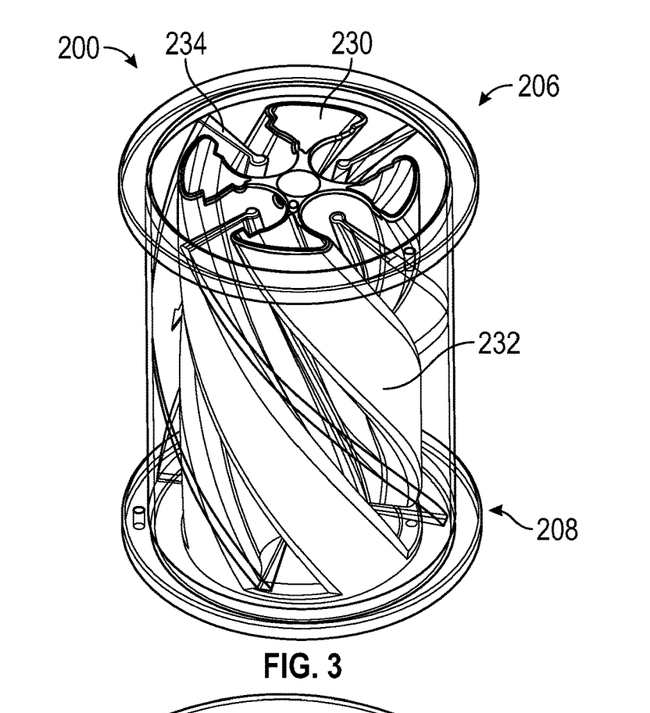
FIG. 3 illustrates a transparent side view of a coaxial structure of an ESA, in accordance with a representative embodiment.
Figure 4:
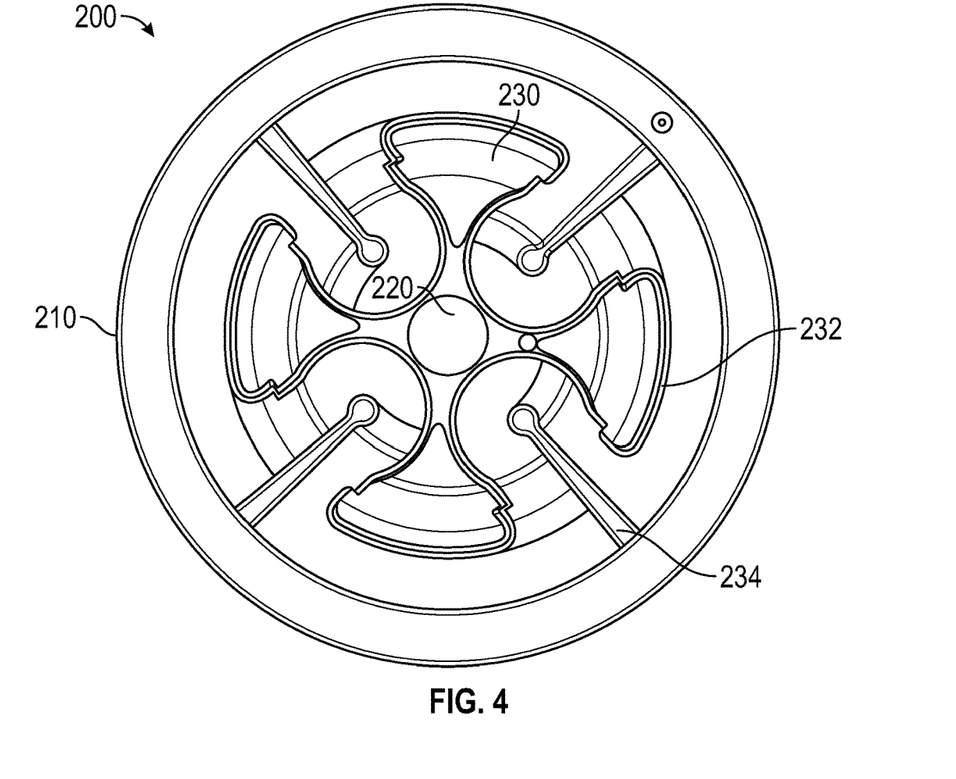
FIG. 4 illustrates a top view of a coaxial structure of an ESA, in accordance with a representative embodiment.

FIGS. 2-4 show further details of a coaxial structure 200 that may be included in an ESA according to the present teachings, such as the ESA 100 shown in FIG. 1. Specifically, FIG. 2 illustrates an exploded view of a coaxial structure 200 of an ESA, FIG. 3 illustrates a transparent side view of the coaxial structure 200, and FIG. 4 illustrates a top view of the coaxial structure 200, in accordance with a representative embodiment. As shown in these figures, the coaxial structure 200 may have one or more channels 232 formed therein, where the shape of the coaxial structure 200 may have a notch-and-vane design that resembles a cloverleaf, e.g., with four channels 232 forming each "leaf" of the cloverleaf shape.

Thus, as explained herein, the coaxial structure 200 may define one or more pathways 230 disposed between an outer conductive cylinder 210 and an inner conductive cylinder 220, where the pathways 230 extend from a first end 206 of the coaxial structure 200 to a second end 208 of the coaxial structure 200. The outer conductive cylinder 210 and the inner conductive cylinder 220 may each be structurally configured to receive a bias voltage for the creation of a predetermined electric field therebetween that allows for the passage of charged particles with a predetermined energy/charge band along a helical path through the coaxial structure 200.

As described above, at least one of the pathways 230 of the coaxial structure 200 may be contained in a channel 232 formed between the first end 206 of the coaxial structure 200 and the second end 208 of the coaxial structure 200. The channel 232 may be shaped as a helical structure disposed at least partially about the inner conductive cylinder 220 as shown in the figures. More specifically, the channel 232 may be sized and shaped to permit certain particles to travel within the channel 232 from the first end 206 of the coaxial structure 200 to the second end 208 of the coaxial structure 200, and to prevent other particles from traveling within the channel 232 from the first end 206 of the coaxial structure 200 to the second end 208 of the coaxial structure 200. For example, a channel 232 may be sized and shaped to block photons from traversing from the first end 206 of the coaxial structure 200 to the second end 208 of the coaxial structure 200, e.g., where these photons might interfere with an analysis of charged particles. That is, photons that reach the electron multiplier may generate false counts, and thus, blocking such photons from reaching the electron multiplier may be desired. Similarly, the channel 232 may also or instead be sized and shaped to block photons from traversing from an external environment to the second end 208 of the coaxial structure 200. The channel 232 may also or instead be sized and shaped to block photons from traversing from one channel 232 to another, different channel 232.

At least one of the pathways 230 of the coaxial structure 200 (e.g., each pathway 230) may be contained in its own distinct channel 232 formed between the first end 206 of the coaxial structure 200 and the second end 208 of the coaxial structure 200. The number of channels 232 may vary from ESA to ESA. For example, in certain implementations, the coaxial structure 200 may include at least two distinct channels 232; in other implementations, the coaxial structure 200 may include at least four distinct channels 232 as shown in the figures. For example, and as discussed above, a formation of four distinct channels 232 may resemble a cloverleaf-type structure. Such a cloverleaf-type structure may provide a relatively complex shape that effectively channelizes the ESA. Also, or instead, an opening for each channel 232 may be disposed about 90-degrees from one another at the first end 206 of the coaxial structure 200. Other arrangements for the channels 232 are also or instead possible.

The coaxial structure 200 (or an ESA containing the coaxial structure 200) may include one or more baffles 234 therein or thereon. For example, a baffle 234 may be disposed between each distinct channel 232. In this manner, a baffle 234 may act as a dissipative insulator. In certain implementations, at least one pathway is defined by one or more baffles 234 disposed between the inner conductive cylinder 220 and the outer conductive cylinder 210. The baffles 234 may also or instead aid in blocking photons from traversing through the coaxial structure 200. Thus, a baffle 234 may be structurally configured to block photons from traveling from one pathway 230 or channel 232 to another pathway 230 or channel 232. Also, or instead, a baffle 234 may be structurally configured to block photons from traversing from the first end 206 of the coaxial structure 200 to the second end 208 of the coaxial structure 200, and/or from traversing from an external environment to the first end 206 or the second end 208 of the coaxial structure 200. In certain implementations, a baffle 234 may be less conductive than each of the outer conductive cylinder 210 and the inner conductive cylinder 220. To this end, a baffle 234 may include a static dissipative material.

Figure 5:
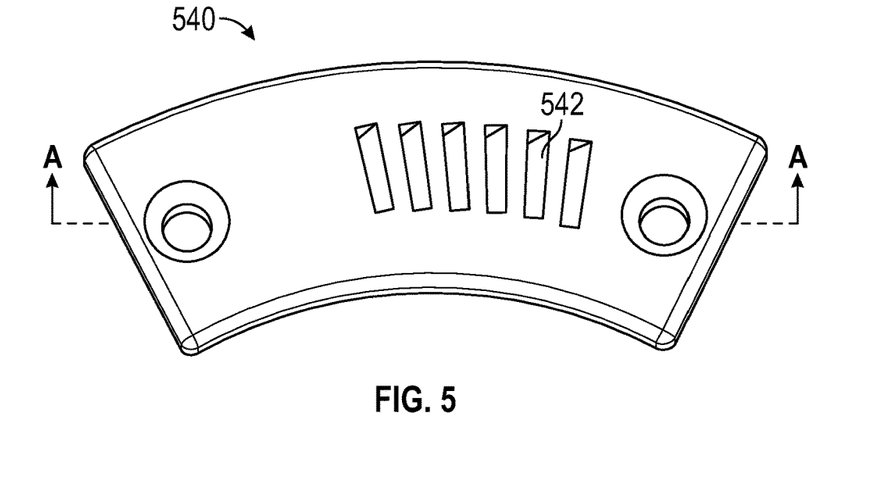
FIG. 5 illustrates a top view of an entrance filter of an ESA, in accordance with a representative embodiment.
Figure 6:
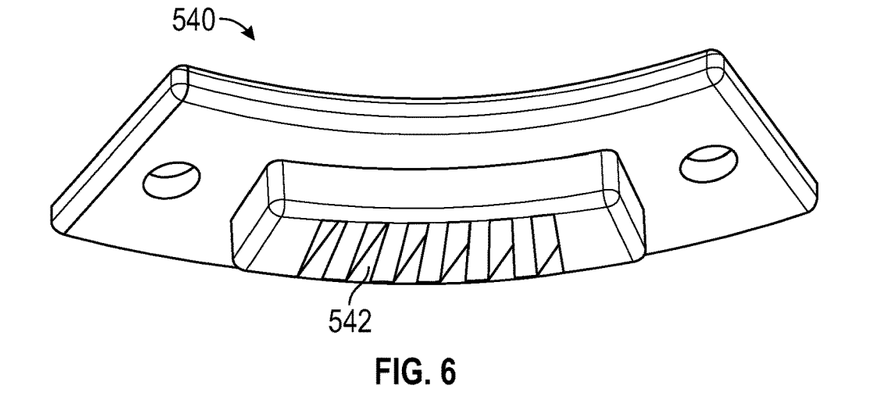
FIG. 6 illustrates a bottom perspective view of an entrance filter of an ESA, in accordance with a representative embodiment.
Figure 7:
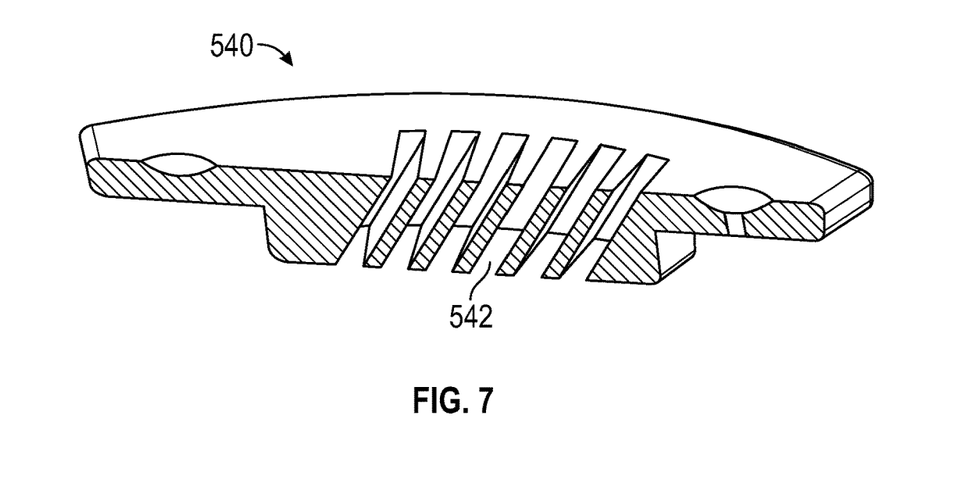
FIG. 7 illustrates a cutaway of an entrance filter of an ESA through Section A-A of FIG. 5, in accordance with a representative embodiment.

FIGS. 5-7 show further details of an entrance filter 540 that may be included in an ESA according to the present teachings, such as the ESA 100 shown in FIG. 1. Specifically, FIG. 5 illustrates a top view of the entrance filter 540 of an ESA, FIG. 6 illustrates a bottom perspective view of the entrance filter 540, and FIG. 7 illustrates a cutaway of the entrance filter 540 through Section A-A of FIG. 5, in accordance with a representative embodiment.

As discussed herein, the entrance filter 540 may be placed on the first end of a coaxial structure of an ESA, where the entrance filter 540 is disposed between a pathway through the coaxial structure and an external environment. The entrance filter 540 may define a plurality of openings 542 aligned at a predetermined angle thereby limiting one or more fields of view between a pathway through the coaxial structure and an external environment. Thus, the entrance filter 540 may be structurally configured to filter particles, by their trajectory, from entering the coaxial structure (or traveling therethrough) for analysis by an ESA.

Various equations used to design an ESA according to the present teachings are provided below.

Definitions $$eV = 1.602 \cdot 10^{-19} \cdot J$$

$$keV = 1 \cdot 10^3 \cdot eV$$

$$q = 1.6 \cdot 10^{-19} \cdot C$$

Outer cylinder radius ($r_o$), inner cylinder radius ($r_i$), cylinder height (L).

$$r_{bar} = \frac{(r_o + r_i)}{2}$$

$$\Delta r = r_o - r_i$$

Focal point of a cylinder ESA:

$$\frac{\pi}{\sqrt{2}} = 127.279 \text{ deg}$$

Pitch angle of particle spiral trajectory that exits cylinders at focal point:

$$\gamma = \text{atan}\left(\frac{\pi}{\sqrt{2}} \cdot \frac{r_{bar}}{L}\right)$$

Analyzer constant (ratio of particle energy to cylindrical electric field):

$$\eta = \frac{1}{\ln\left(\frac{r_o}{r_i}\right) \cdot \sin(\gamma)^2}$$

Electric field between cylinders to select energy ($E_v$):

$$\phi_{defl} = \frac{(2 \cdot E_v)}{q \cdot \eta}$$

For an ESA, ΔE/E (energy bandwidth) is a function of the aperture dimensions and the average radii of the cylinders. More particularly, the energy bandwidth may be dependent on the number, position, and geometry of the apertures. That is, the energy bandwidth is generally a function of this geometry, but it is independent of the energy channel selected.

ESAs as described herein may be used in a spaceflight environment, as these ESAs may address one or more needs of the operational spaceflight environment, including without limitation: having a relatively compact size, having a relatively high analyzer constant, having a relatively low weight, using relatively low power, having a relatively large geometric factor, having multiple collimated fields of view, including solar light rejection, having a relatively long service life, having a relatively high temporal resolution, and being relatively easy to perform tuning. Thus, an ESA as described herein may be used for spaceflight environmental energetic particle monitoring. Also, or instead, an ESA as described herein may be used as an element of ground laboratory test systems including, but not limited to, mass spectrometry and medical radiation therapy. Therefore, although an ESA as described herein may be primarily designed to be used as a charged particle detector for use in space, it will be understood that an ESA as described herein may also or instead have applications in scientific laboratories or radiation therapy (e.g., as an energy filter or mass spectrometer for charged particles).

In use, the apertures or openings of the ESA should be positioned so as to capture particles directed towards the ESA. These particles may then be permitted to travel through the ESA analyzer plates, which may pass the particles having the appropriate energy through the analyzer and cause other particles to impact the walls. Charge multipliers in the ESA may collect the particles and amplify the signal in order to produce a measurable current pulse. The bias applied to the analyzer plates may be variable and controlled by controller (e.g., a microcontroller or similar device) so that any number of particle energies can be selected. This bias control may also or instead be programmable, e.g., via commands relayed from a user (e.g., to a host spacecraft, and then to the ESA). The energy value and dwell time of a measurement may be determined based on the spacecraft environment. Charged particle detections during a measurement period for a given energy may be counted, recorded, formatted (e.g., into data packets or the like), and transmitted from the ESA to a user, e.g., via a spacecraft telemetry system and associated ground support elements.

As discussed herein, one or more components of the ESA may be 3D printed or otherwise manufactured using additive manufacturing technology. For example, the entrance filters, and the notch-and-vane coaxial cylinder design can be produced using additive manufacturing techniques. One or more components of the ESA may also or instead be produced using high-end machining processes and/or mold casting.

An ESA as described herein may be adaptable for specific purposes or design parameters. For example, the height and radii of the cylinders may be specifically configured for a predetermined purpose. Also, or instead, one or more of the angle, size, and shape of the openings of the entrance filter, as well as the number of openings, can be configured for a specific purpose. Further, a number or type of charge multipliers may be adjusted to match the performance characteristics desired for an ESA. For example, the size, shape, and other physical characteristics of charge multipliers may be specifically tailored for a particular application. By way of example, a charge multiplier may be placed at the center of the cylinders or some other location (a location without an entrance aperture) to act as a background detector. In general, the cylinders may be made of an electrically conductive material to provide electrical conductivity, and insulating endcaps may be included for mounting the ESA (e.g., in certain implementation, the endcaps or housing should be highly insulating to prevent current leakage and/or voltage breakdown).

As discussed herein, an ESA may include UV mitigation. This may include a notch-and-vane design or a cylindrical design with dissipative material dividers/baffles placed in-between charge multiplier channels. The material used may be resistive to avoid current leakage and breakdown, but also static dissipative to prevent charge build-up that can cause deformation of the electric fields of the analyzer and potential arcs.

Another configuration of an ESA as described herein includes a nested double ESA design for detecting both electrons and ions. For example, an ESA may include three cylinders, e.g., with the middle cylinder serving as one of the analyzer plates. Here, the use of a static dissipative material as physical dividers between individual field of view directions could also or instead provide a reduction in scattered photons. Thus, in an alternate embodiment, an ESA may include a third conductive cylinder, where the third conductive cylinder is disposed within the inner conductive cylinder, and where the third conductive cylinder is structurally configured to serve as an analyzer plate for the ESA.

Further, an ESA as described herein may generally include a housing and one or more pathways extending from a first end of the housing to a second end of the housing, where the pathways are structurally configured to allow, therethrough, a passage of charged particles having a predetermined energy/charge band. The ESA may also include one or more entrance filters on the first end of the housing disposed between a pathway and an external environment. An entrance filter may define a plurality of openings aligned at a predetermined angle thereby limiting one or more fields of view between a pathway and the external environment to filter particles, by their trajectory, from entering the pathway for analysis by the ESA.

Figure 8:
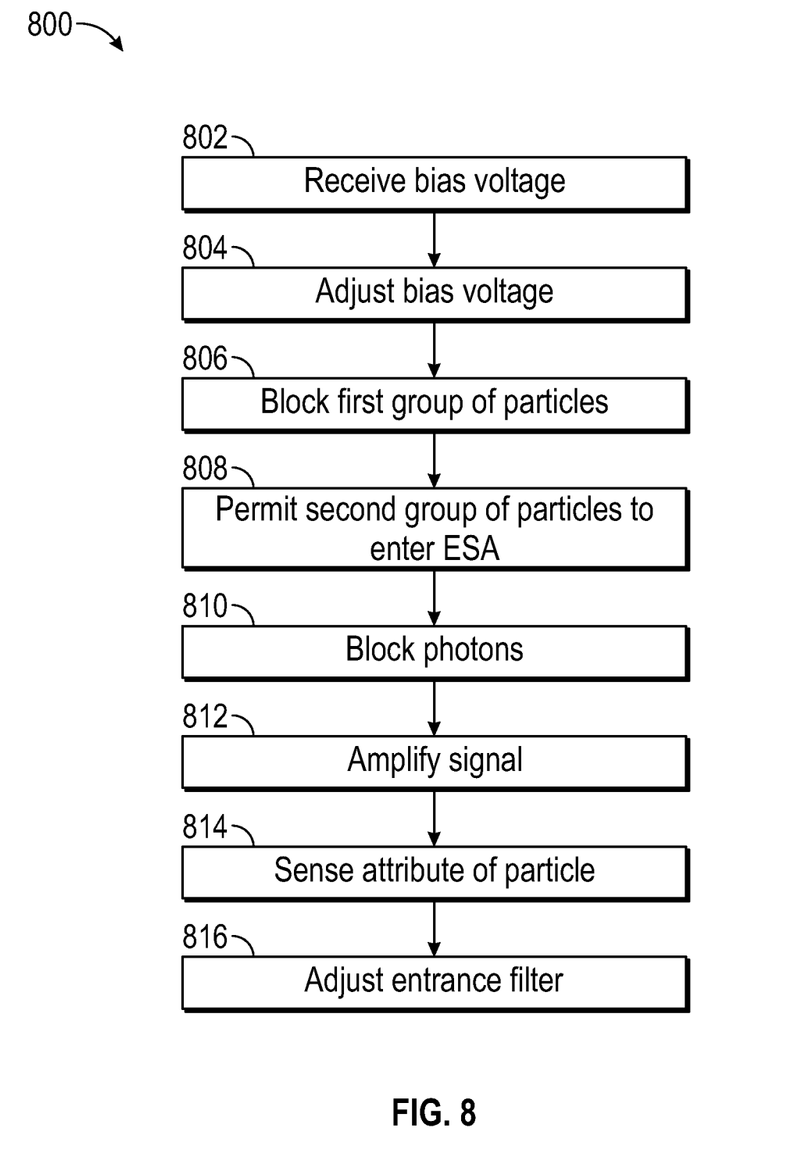
FIG. 8 is a flow chart of a method for analyzing charged particles, in accordance with a representative embodiment.

FIG. 8 is a flow chart of a method 800 for analyzing charged particles, in accordance with a representative embodiment. The method 800 may include the use of one or more of the ESAs (or systems containing the ESAs) as described herein. For example, one or more of the ESAs as described herein may perform the method 800.

As shown in block 802, the method 800 may include receiving a bias voltage at one or more of an outer conductive cylinder and an inner conductive cylinder of an ESA (e.g., both the outer conductive cylinder and inner conductive cylinder).

As shown in block 804, the method 800 may include adjusting the bias voltage applied to one or more of the outer conductive cylinder and the inner conductive cylinder, e.g., using a controller or the like.

As shown in block 806, the method 800 may include blocking a first group of charged particles having a first trajectory from entering the ESA using an entrance filter disposed on a first end of the ESA. The entrance filter may define one or more openings disposed at a predetermined angle.

As shown in block 808, the method 800 may include permitting a second group of charged particles to enter the ESA through the entrance filter. The second group of charged particles may have a second trajectory that is different from the first trajectory of the first group of charged particles that is blocked from entering the ESA using the entrance filter. To this end, the predetermined angle of one or more of the openings may thus be substantially aligned with the second trajectory.

As shown in block 810, the method 800 may include blocking photons. Photons may be blocked, for example, using walls of a channel that defines the pathway for one or more particles of the second group of charged particles to travel through the ESA. Also, or instead, photons may be blocked using one or more baffles that define a pathway for one or more particles of the second group of charged particles to travel through the ESA.

As shown in block 812, the method 800 may include amplifying a signal pertaining to a particle or an attribute of the particle. It will be understood that a charge multiplier or the like may be used to this end.

As shown in block 814, the method 800 may include sensing an attribute of one or more particles of the second group of charged particles that travel through a pathway disposed between the outer conductive cylinder and the inner conductive cylinder to a second end of the ESA. It will be understood that sensing an attribute may include filtering based on the kinetic energy and charge of the particles. Thus, in this manner, sensing an attribute may simply include detecting the particles that are filtered according to their energy and charge.

As shown in block 816, the method 800 may include adjusting the entrance filter to change the predetermined angle of one or more of the openings. Thus may include removing and replacing the entrance filter.

The above systems, devices, methods, processes, and the like may be realized in hardware, software, or any combination of these suitable for a particular application. The hardware may include a general-purpose computer and/or dedicated computing device. This includes realization in one or more microprocessors, microcontrollers, embedded microcontrollers, programmable digital signal processors or other programmable devices or processing circuitry, along with internal and/or external memory. This may also, or instead, include one or more application specific integrated circuits, programmable gate arrays, programmable array logic components, or any other device or devices that may be configured to process electronic signals. It will further be appreciated that a realization of the processes or devices described above may include computer-executable code created using a structured programming language such as C, an object oriented programming language such as C++, or any other high-level or low-level programming language (including assembly languages, hardware description languages, and database programming languages and technologies) that may be stored, compiled, or executed to run on one of the above devices, as well as heterogeneous combinations of processors, processor architectures, or combinations of different hardware and software. In another implementation, the methods may be embodied in systems that perform the steps thereof, and may be distributed across devices in a number of ways. At the same time, processing may be distributed across devices such as the various systems described above, or all of the functionality may be integrated into a dedicated, standalone device or other hardware. In another implementation, means for performing the steps associated with the processes described above may include any of the hardware and/or software described above. All such permutations and combinations are intended to fall within the scope of the present disclosure.

Embodiments disclosed herein may include computer program products comprising computer-executable code or computer-usable code that, when executing on one or more computing devices, performs any and/or all of the steps thereof. The code may be stored in a non-transitory fashion in a computer memory, which may be a memory from which the program executes (such as random-access memory associated with a processor), or a storage device such as a disk drive, flash memory or any other optical, electromagnetic, magnetic, infrared or other device or combination of devices. In another implementation, any of the systems and methods described above may be embodied in any suitable transmission or propagation medium carrying computer-executable code and/or any inputs or outputs from same.

It will be appreciated that the devices, systems, and methods described above are set forth by way of example and not of limitation. Absent an explicit indication to the contrary, the disclosed steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context. So, for example performing the step of X includes any suitable method for causing another party such as a remote user, a remote processing resource (e.g., a server or cloud computer) or a machine to perform the step of X. Similarly, performing steps X, Y, and Z may include any method of directing or controlling any combination of such other individuals or resources to perform steps X, Y, and Z to obtain the benefit of such steps. Thus, method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It should further be appreciated that the methods above are provided by way of example. Absent an explicit indication to the contrary, the disclosed steps may be modified, supplemented, omitted, and/or re-ordered without departing from the scope of this disclosure.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. An electrostatic analyzer, comprising:
   a coaxial structure, comprising:
     an outer conductive cylinder defining a void;
     an inner conductive cylinder at least partially within the void; and
     one or more pathways disposed between the outer conductive cylinder and the inner conductive cylinder, with each of the pathways being contained in its own distinct channel formed between a first end of the coaxial structure and a second end of the coaxial structure, and there being at least four of the distinct channels, where the outer conductive cylinder and the inner conductive cylinder are each structurally configured to receive a bias voltage for creation of a predetermined electric field therebetween that allows for passage of charged particles with a predetermined energy along a helical path through the coaxial structure; and
   one or more entrance filters on the first end of the coaxial structure disposed between the one or more pathways and an external environment, the one or more entrance filters defining a plurality of openings aligned at a predetermined angle thereby limiting one or more fields of view between the one or more pathways and the external environment to filter particles, by their trajectory, from entering the one or more pathways for analysis by the electrostatic analyzer.

2. The electrostatic analyzer of claim 1, where particles that traverse through the one or more pathways from the external environment to the second end of the coaxial structure are controlled according to a kinetic energy of the particles by one or more of (i) the bias voltage applied to one or more of the outer conductive cylinder and the inner conductive cylinder, (ii) a length and a radius of one or more of the outer conductive cylinder and the inner conductive cylinder, and (iii) the predetermined angle of the plurality of openings of the one or more entrance filters.

3. The electrostatic analyzer of claim 1, where at least one of the channels is shaped as a helical structure disposed at least partially about the inner conductive cylinder.

4. The electrostatic analyzer of claim 1, where at least one of the channels is sized and shaped to permit certain particles to travel within the channel from the first end of the coaxial structure to the second end of the coaxial structure.

5. The electrostatic analyzer of claim 1, where at least one of the channels is sized and shaped to block photons from reaching the second end of the coaxial structure.

6. The electrostatic analyzer of claim 1, further comprising one or more baffles structurally configured to block photons from the external environment from reaching the second end of the coaxial structure.

7. The electrostatic analyzer of claim 1, where the predetermined angle is adjustable.

8. The electrostatic analyzer of claim 1, where there is a separate entrance filter for each pathway of the one or more pathways, each separate entrance filter comprising a plurality of openings.

9. The electrostatic analyzer of claim 1, where an entrance filter of the one or more entrance filters is removable and replaceable on the first end of the coaxial structure.

10. The electrostatic analyzer of claim 1, further comprising a controller configured to adjust a bias voltage applied to one or more of the outer conductive cylinder and the inner conductive cylinder.

11. The electrostatic analyzer of claim 1, further comprising a charge multiplier structurally configured to collect and amplify a signal obtained from a particle at the second end of the coaxial structure.

* * * * *